United States Patent
Tseng et al.

(10) Patent No.: US 9,323,881 B2
(45) Date of Patent: *Apr. 26, 2016

(54) METHOD AND LAYOUT OF AN INTEGRATED CIRCUIT

(71) Applicants: Hsiang-Jen Tseng, Hsinchu (TW); Ting-Wei Chiang, New Taipei (TW); Wei-Yu Chen, Hsinchu (TW); Ruei-Wun Sun, Shuishang Township (TW); Hung-Jung Tseng, Zhubei (TW); Shun Li Chen, Tainan (TW); Li-Chun Tien, Tainan (TW)

(72) Inventors: Hsiang-Jen Tseng, Hsinchu (TW); Ting-Wei Chiang, New Taipei (TW); Wei-Yu Chen, Hsinchu (TW); Ruei-Wun Sun, Shuishang Township (TW); Hung-Jung Tseng, Zhubei (TW); Shun Li Chen, Tainan (TW); Li-Chun Tien, Tainan (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/341,130

(22) Filed: Jul. 25, 2014

(65) Prior Publication Data

US 2014/0332971 A1 Nov. 13, 2014

Related U.S. Application Data

(63) Continuation of application No. 13/778,912, filed on Feb. 27, 2013, now Pat. No. 8,819,610.

(60) Provisional application No. 61/750,655, filed on Jan. 9, 2013.

(51) Int. Cl.
G06F 17/50 (2006.01)
H01L 23/482 (2006.01)

(52) U.S. Cl.
CPC ........ *G06F 17/5077* (2013.01); *G06F 17/5068* (2013.01); *G06F 17/5072* (2013.01); *H01L 23/4824* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 5,384,726 A | 1/1995 | Tomita et al. | |
| 6,480,989 B2 | 11/2002 | Chan et al. | |
| 6,608,612 B2 | 8/2003 | Kokubun et al. | |
| 6,759,698 B2 | 7/2004 | Tanaka | |
| 7,761,831 B2 | 7/2010 | Mai et al. | |
| 8,063,417 B2 | 11/2011 | Kusumoto | |
| 8,106,478 B2 | 1/2012 | Hashimoto et al. | |
| 8,344,427 B2 | 1/2013 | Omura | |
| 8,569,835 B2 | 10/2013 | Yasumori et al. | |
| 8,762,897 B2 * | 6/2014 | Chang | G06F 17/5009 378/35 |
| 2002/0045995 A1 | 4/2002 | Shimazaki et al. | |
| 2008/0173914 A1 | 7/2008 | Hashimoto et al. | |
| 2011/0272776 A1 | 11/2011 | Omura | |
| 2013/0082277 A1 | 4/2013 | Park et al. | |
| 2013/0311957 A1 * | 11/2013 | Chang | G06F 17/5009 716/50 |

* cited by examiner

*Primary Examiner* — Leigh Garbowski
(74) *Attorney, Agent, or Firm* — Hauptman Ham, LLP

(57) ABSTRACT

An integrated circuit layout includes a P-type active region and an N-type active region, and a plurality of trunks. The integrated circuit layout further includes a first metal connection connected to the P-type active region; and a second metal connection connected to the N-type active region. Each trunk of the plurality of trunks is electrically connected with the first metal connection and the second metal connection. Each trunk of the plurality of trunks is substantially perpendicular to the first metal connection and the second metal connection. A first trunk of the plurality of trunks has a width wider than a width of other trunks of the plurality of trunks.

20 Claims, 5 Drawing Sheets

METHOD AND LAYOUT OF AN INTEGRATED CIRCUIT

PRIORITY CLAIM

The present application is a continuation of U.S. application Ser. No. 13/778,912, filed Feb. 27, 2013, which claims the priority of U.S. Provisional Application No. 61/750,655, filed Jan. 9, 2013, the disclosures of which are incorporated herein by reference in their entireties.

FIELD OF DISCLOSURE

The present disclosure is related to integrated circuits and, more particularly, to layout of integrated circuits.

BACKGROUND

The trend in very-large-scale integration (VLSI) technology has resulted in narrower interconnection lines and smaller contacts. Furthermore, integrated circuit designs are becoming more complex and denser. More devices are compressed in integrated circuits to improve performance. With higher current density, integrated circuits become more susceptible to electromigration (EM) causing the circuits to fail.

EM is a phenomenon that, at higher current density and/or increased device temperature, causes electron momentum to be transferred to atoms in thin film metallic conductors (e.g., signal nets) causing a net atomic flux. The atomic flux leads to voids which can cause a circuit to break open or to have hillocks, e.g., accumulation of metal leading to shorts with adjacent metal lines (e.g., signal nets).

Moreover, when there is too much current density through an interconnect for an extended period of time, resistance of the interconnect increases. The increased resistance results in self-heating and metal disintegration. The operating frequency and the reliability of semiconductor circuit are also deteriorated.

DETAILED DESCRIPTION

Making and using various embodiments of the disclosure are discussed in detail below. It should be appreciated, however, that the embodiments provide many applicable inventive innovations that can be embodied in a wide variety of specific contexts. The specific embodiments discussed are merely illustrative, and do not limit the scope of the disclosure.

Some embodiments have one or a combination of the following features and/or advantages. An integrated circuit layout includes a P-type active region, an N-type active region, a first metal connection, a second metal connection, a third metal connection, a VDD power supply line and a VSS power supply line. The integrated circuit layout further includes a plurality of trunks that are substantially formed side-by-side and are substantially in parallel with each other. The first metal connection is substantially disposed over the P-type active region, and is electrically connected with drain regions of PMOS transistors in the P-type active region. The second metal connection is substantially disposed over the N-type active region, and is electrically connected with drain regions of NMOS transistors in the N-type active region. The VDD power supply line is electrically connected with source regions of the PMOS transistors in the P-type active region. The VSS power supply line is electrically connected with source regions of the NMOS transistors in the N-type active region. The plurality of trunks is electrically connected with and is substantially perpendicular to the first metal connection and the second metal connection. The plurality of trunks is substantially perpendicular to the VDD power supply line and the VSS power supply line. A first trunk of the plurality of trunks has a width wider than a width of other trunks and is arranged to be located between two groups of trunks. A third metal connection is disposed over and is electrically connected with the first and the second metal connections through at least two conductive vias. In some embodiments, one of the at least two conductive vias includes a via array or a slot via. A width of the third metal connection is substantially larger than or equal to a width of the first trunk of the plurality of trunks.

Figure 1:
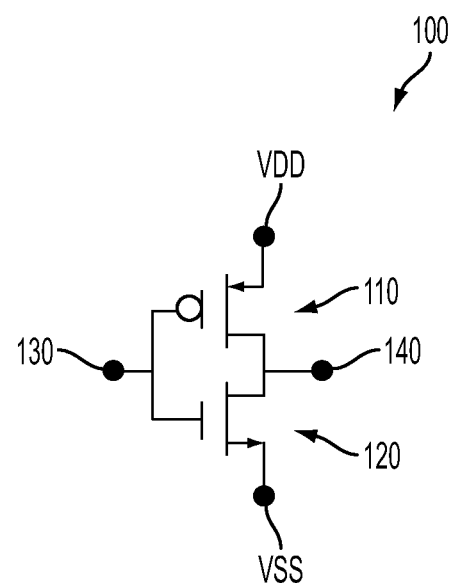
FIG. 1 is a schematic diagram of an inverter gate in accordance with some embodiments.

FIG. 1 is a schematic diagram of an inverter gate 100 according to some embodiments. The inverter gate 100 includes a PMOS (P-channel Metal Oxide Semiconductor) transistor 110 and an NMOS (N-channel Metal Oxide Semiconductor) transistor 120. An input port 130 of the inverter gate 100 is electrically connected to gate terminals of the PMOS transistor 110 and the NMOS transistor 120. An output port 140 of the inverter gate 100 is electrically connected to drain terminals of the PMOS transistor 110 and the NMOS transistor 120.

When the input port 130 is set to "0" (for example, ground voltage), the PMOS transistor 110 is turned on and the NMOS transistor 120 is turned off. In such a situation, current flows from VDD through the PMOS transistor 110 to the output port 140. When the input port 130 is set to "1" (for example, operation voltage), the PMOS transistor 110 is turned off and the NMOS transistor 120 is turned on. In such a situation, current flows from the output port 140 through the NMOS transistor 120 to VSS.

Figure 2:
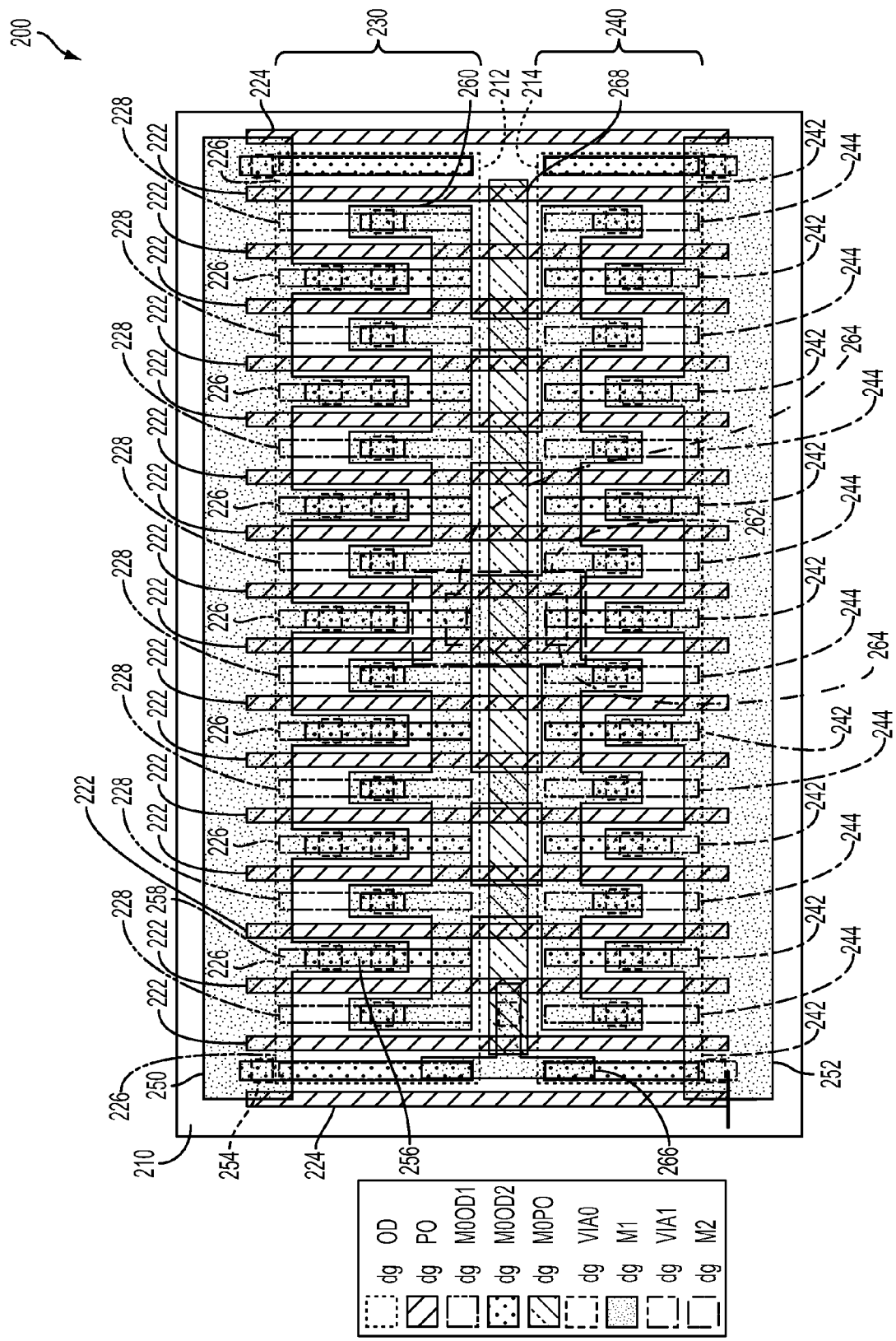
FIG. 2 is a top view of a layout illustrating a multi-finger layout example for the inverter gate in FIG. 1 in accordance with some embodiments.

FIG. 2 is a top view of a layout 200 according to some embodiments. The layout 200 illustrates a multi-finger layout example for the inverter gate 100 in FIG. 1. In FIG. 2, a semiconductor substrate, active areas, gate electrode layers and various metallic layers are overlapped. Semiconductor substrate 210 is a silicon or another suitable semiconductor substrate. P-type active region 212 and N-type active region 214 are formed within the semiconductor substrate 210. In some embodiments, an active region, such as the active regions 212 and 214, is also referred to herein as OD (oxide-dimensioned region).

Gate electrodes 222 and dummy gate electrodes 224 are disposed over the P-type active region 212 and N-type active region 214, and are arranged in parallel with each other and equally spaced apart. The gate electrodes 222 and the dummy gate electrodes 224 are formed of polysilicon or other conductive materials such as metals, metal alloys and metal silicides. The dummy gate electrodes 224 are arranged to not act as a gate to any transistor. In some embodiments, a gate electrode and a dummy gate electrode, such as the gate electrodes 222 and the dummy gate electrodes 224, are also referred to herein as PO.

A first transistor region 230 of the layout 200 is arranged to form the PMOS transistor 110 in FIG. 1. The first transistor region 230 includes an upper portion of the gate electrodes 222, source regions 226 and drain regions 228. Each of the source regions 226 and the drain regions 228 are formed in the P-type active region 212. Each of adjacent source regions 226 and drain regions 228 are on opposite sides of a corresponding gate electrode 222. In such a situation, each of the adjacent source regions 226, the drain regions 228 and corresponding gate electrode 222 form a PMOS transistor.

A VDD power supply line 250 is implemented, for example, in a metal one line. In some embodiments, a metal one line is referred to herein as M1. In a top-down sequence, the VDD power supply line 250 is connected through conductive via zeros 254, upper conductive metal segments 256 and lower conductive metal segments 258 to each of the source regions 226 of the corresponding PMOS transistors. In some embodiments, the lower conductive metal segment 258 is disposed over and is electrically coupled with the source regions 226. The upper conductive metal segment 256 is disposed over and is electrically coupled with the lower conductive metal segment 258. In some embodiments, the upper conductive metal segment is in direct contact with the lower conductive metal segment 258. A conductive via zero 254 is disposed over and is electrically coupled with the upper conductive metal segment 256.

For illustration purposes, only one conductive via zero 254, one upper conductive metal segment 256 and one lower conductive metal segment 258 are labeled. In some embodiments, a conductive via zero is referred to herein as VIA0. Upper conductive metal segment is referred to herein as M0-OD2. Lower conductive metal segment is referred to herein as M0-OD1.

A second transistor region 240 of the layout 200 is arranged to form the NMOS transistor 120 in FIG. 1. The second transistor region 240 includes a lower portion of the gate electrodes 222, source regions 242 and drain regions 244. Each of the source regions 242 and the drain regions 244 are formed in the N-type active region 214. Each of adjacent source regions 242 and drain regions 244 are on opposite sides of a corresponding gate electrode 222. In such a situation, each of the adjacent source regions 242, the drain regions 244 and corresponding gate electrode 222 forms an NMOS transistor. A VSS power supply line 252 is implemented, for example, in the metal one line. In a top-down sequence, a VSS ground line 252 is connected through conductive via zeros 254, upper conductive metal segments 256 and lower conductive metal segments 258 to each of the source regions 242 of the corresponding NMOS transistors.

The drain regions 228 of each of the PMOS transistors in the first transistor region 230 are electrically connected through metal one line 260 to the drain regions 244 of each of the NMOS transistors in the second transistor region 240. In some embodiments, in a top-down sequence, the metal one line 260 is connected through conductive via zeros 254, upper conductive metal segments 256 and lower conductive metal segments 258 to the drain regions 228 of each of the PMOS transistors and the drain regions 244 of each of the NMOS transistors. The output port 140 of the inverter gate 100 in FIG. 1 on metal two line 262 is electrically connected through conductive via one 264 to the lower metal one line 260 in a top-down sequence. In some embodiments, conductive via one is also referred to herein as VIA1. Metal two line is also referred to herein as M2.

The input port 130 of the inverter gate 100 in FIG. 1 is on metal one line 266. In a top-down sequence, the metal one line 266 is electrically connected through conductive via zero 254, local conductive metal segment 268 to each of the gate electrodes 222. In some embodiments, the local conductive metal segment is also referred to herein as M0PO. In some embodiments, the local conductive metal segment 268 is disposed over and is electrically coupled with each of the gate electrodes 222 such that the heights of the local conductive metal segment 268 plus the heights of the gate electrode 222 are substantially equal to the heights of the upper conductive metal segment 256 plus the heights of the lower conductive metal segment 258. The conductive via zero 254 is disposed over and is electrically coupled with the local conductive metal segment 268. The metal one line 266 is disposed over and is electrically coupled with the conductive via zero 254.

Each of the PMOS transistors formed in the first transistor region 230 of the layout 200, together with each corresponding NMOS transistor formed in the second transistor region 240 of the layout 200, form an inverter gate finger. The inverter gate 100 in FIG. 1 is implemented as a plurality of individual inverter gate fingers wired in parallel in a multi-finger layout configuration such that a driving strength of the inverter gate 100 in FIG. 1 is larger than that of a single finger inverter gate.

Figure 3:
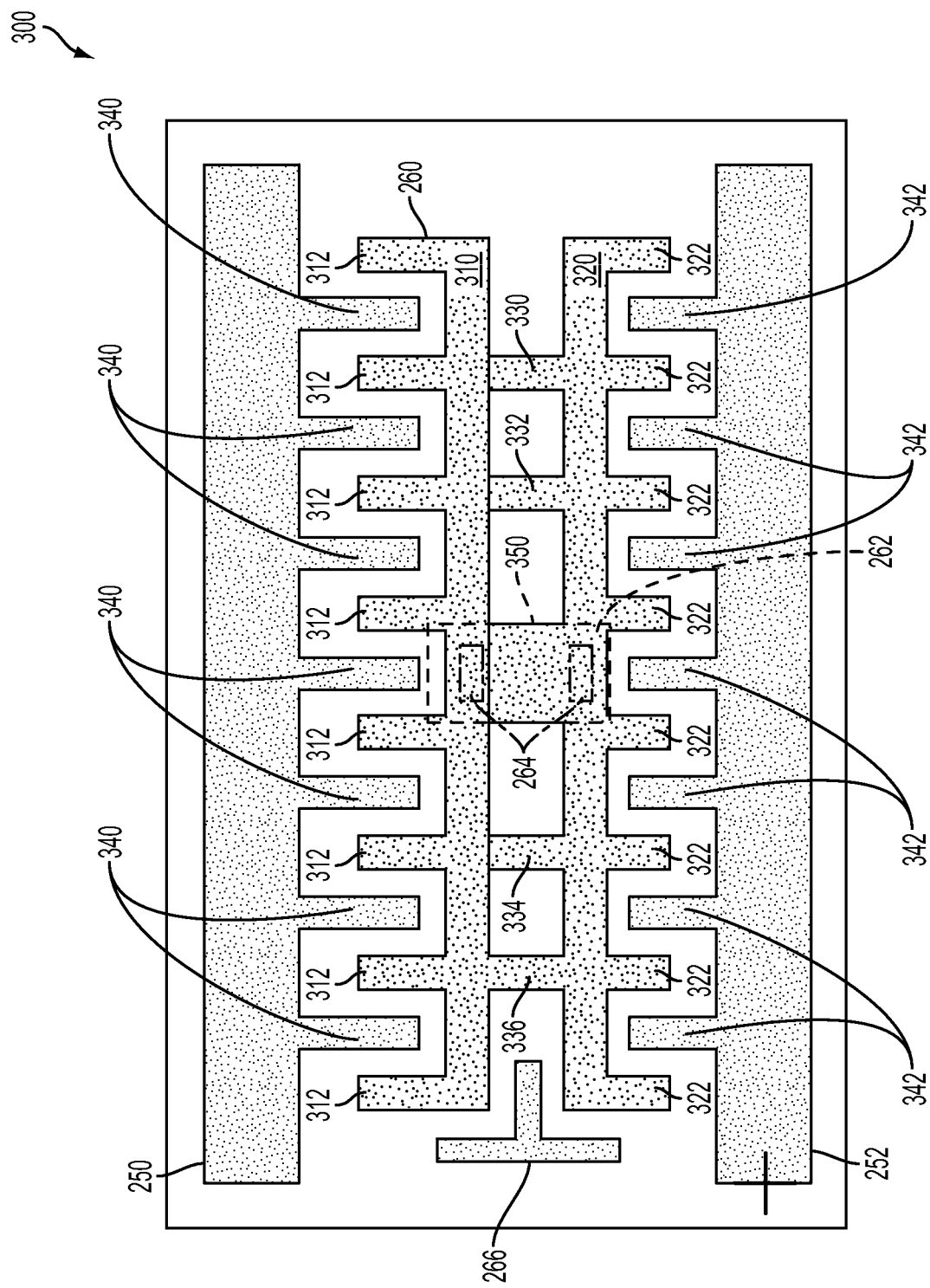
FIG. 3 is a top view of a layout in accordance with some embodiments.

FIG. 3 is a top view of a layout 300 according to some embodiments. The layout 300 includes similar regions and structures of the metal one lines 250, 252, 260, 266, the conductive via ones 264 and the metal two line 262 as the corresponding elements in FIG. 2. The metal one line 250 is also referred to as the VDD power supply line. The metal one line 252 is also referred to as the VSS power supply line. In some embodiments, the VDD power supply line 250 is configured to include a plurality of jogs 340. In some embodiments, the VDD power supply line 250 is configured to not include the plurality of jogs 340. In some embodiments, the VSS power supply line 252 is configured to include a plurality of jogs 342. In some embodiments, the VSS power supply line 252 is configured to not include the plurality of jogs 342.

In some embodiments, the metal one line 260 includes metal one lines 310, 320 and trunks 330-336, 350. The trunks 330-336 and 350 are formed side-by-side and are substantially in parallel with each other. In some embodiments, the trunks 330-336 and 350 are arranged to electrically connect with the metal one lines 310 and 320. In some embodiments, the trunks 330-336 and 350 are substantially perpendicular to long axes of the metal one lines 310 and 320. In some embodiments, the trunks 330-336 and 350 are substantially perpendicular to long axes of VDD power supply line 250 and long axes of VSS power supply line 252. In some embodiments, the long axis of the metal one line 310 is substantially in parallel with the long axis of the metal one line 320. In some embodiments, the metal one line 310 is disposed over the P-type active area 212 in FIG. 2, and the metal one line 320 is disposed over the N-type active area 214 in FIG. 2. In some embodiments, the metal one line 310 is configured to include a plurality of jogs 312. In some embodiments, the metal one line 310 is configured to not include the plurality of jogs 312. In some embodiments, the metal one line 320 is configured to include a plurality of jogs 322. In some embodiments, the metal one line 310 is configured to not include the plurality of jogs 322.

In some embodiments, a first trunk, for example the trunk 350, has a width wider than a width of other trunks such as the trunks 330-336. In some embodiments, the first trunk is arranged to be located at a central area of a space between the metal one lines 310 and 320 and to be located between two groups of trunks. For example, in FIG. 3, the width of the trunk 350 is wider than widths of other trunks such as the trunks 330-336. The trunk 350 is arranged to be located at the central area of the space between the metal one lines 310 and 320. The trunk 350 is also arranged to be located between one group of trunks, including trunks 330, 332, and another group of trunks, including trunks 334, 336.

In some embodiments, the width of the trunk 350 is substantially larger than total widths of the trunks 330-336. In some embodiments, the width of the trunk 350 is substantially equal to total widths of the trunks 330-336. In some embodiments, the width of the trunk 350 is substantially less than total widths of the trunks 330-336.

In some embodiments, the metal two line 262 is disposed over and is electrically coupled with the metal one lines 310 and 320 through at least two conductive via ones 264. In some embodiments, one of the at least two conductive via ones 264 includes a via array that is a group of vias arranged in rows and columns. In some embodiments, one of the at least two conductive via ones 264 includes a slot via that extends with a length in a direction that is substantially in parallel with the metal one lines 310 and 320. In some embodiments, one of the at least two conductive via ones 264 includes a slot via that extends with a length in a direction that is substantially perpendicular to the metal one lines 310 and 320. In some embodiments, the slot via can be any kind of shapes such as a square, a rectangle, etc.

In some embodiments, a width of the metal two line 262 is substantially equal to the width of the trunk 350, and is arranged to align with left and right side boundaries of the trunk 350. In some embodiments, the width of the metal two line 262 is substantially larger than the width of the trunk 350. In some embodiments, the metal two line 262 is arranged to be located between two groups of trunks. For example, the metal two line 262 is arranged to be located between one group of trunks, including trunks 330, 332, and another group of trunks, including trunks 334, 336.

As technology nodes shrink, the resolution of a photoresist pattern in semiconductor fabrication processes begins to blur. To continue to use fabrication equipments purchased for larger technology nodes, multi-exposure methods have been developed. Multiple-patterning technology (MPT) forms patterns on a single layer of an integrated circuit using two or more different masks in succession. In such a situation, pre-coloring information is generated first for the single layer such that patterns in the single layer are assigned to corresponding masks.

Figure 4:
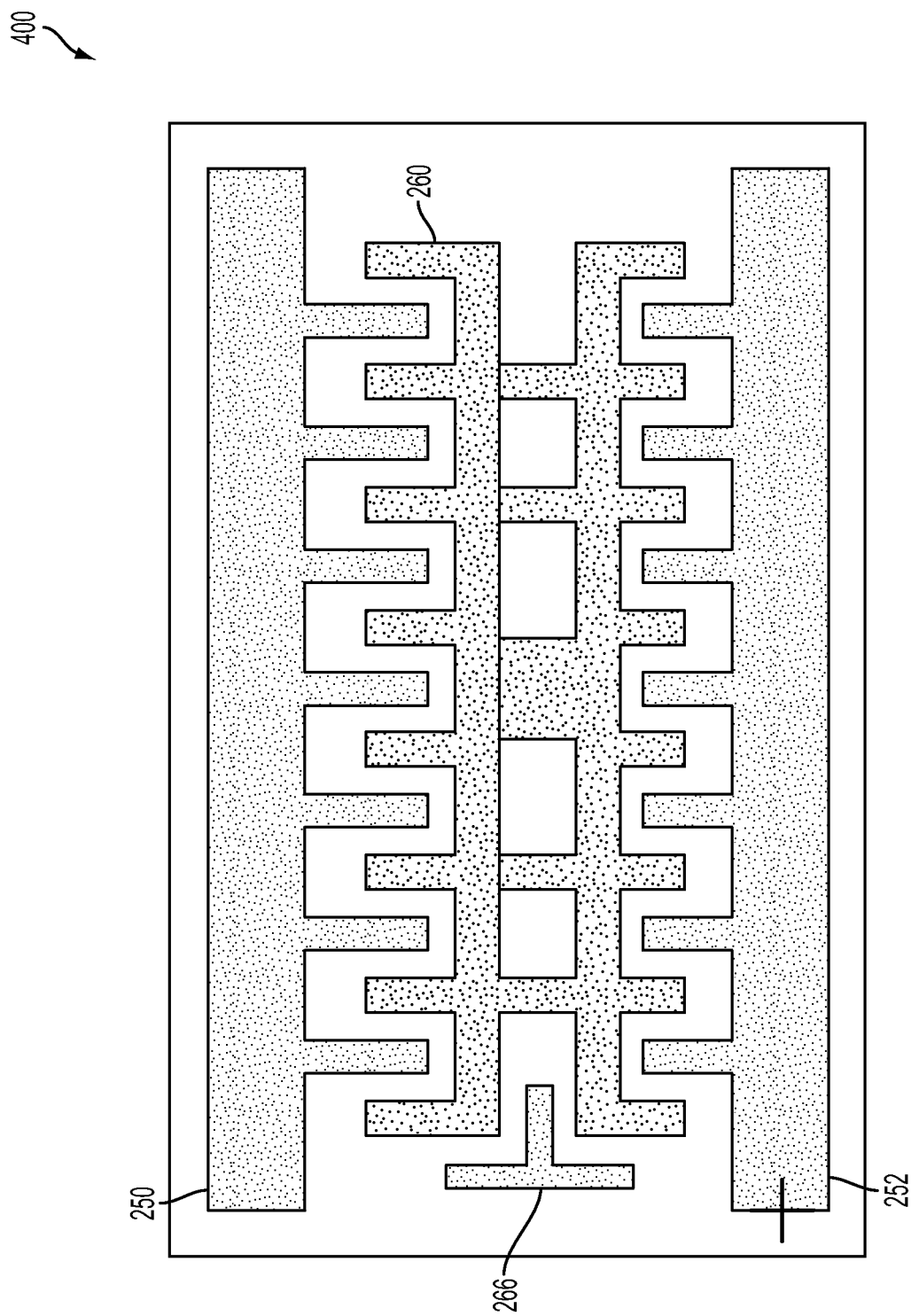
FIG. 4 is a top view of a layout in accordance with some embodiments.

FIG. 4 is a top view of a layout 400 according to some embodiments. The layout 400 includes similar regions and structures of the metal one lines 250, 252, 260 and 266, as the corresponding ones in FIG. 2. In some embodiments, pre-coloring information is generated such that the metal one line 260 is arranged to be on one mask, and the metal one lines 250 and 252 are arranged to be on another mask. In some embodiments, pre-coloring information is generated such that the metal one line 266 is arranged to be on the same mask as the metal one lines 250 and 252. In some embodiments, pre-coloring information is generated such that the metal one line 266 is arranged to be on the same mask as the metal one line 260.

Figure 5:
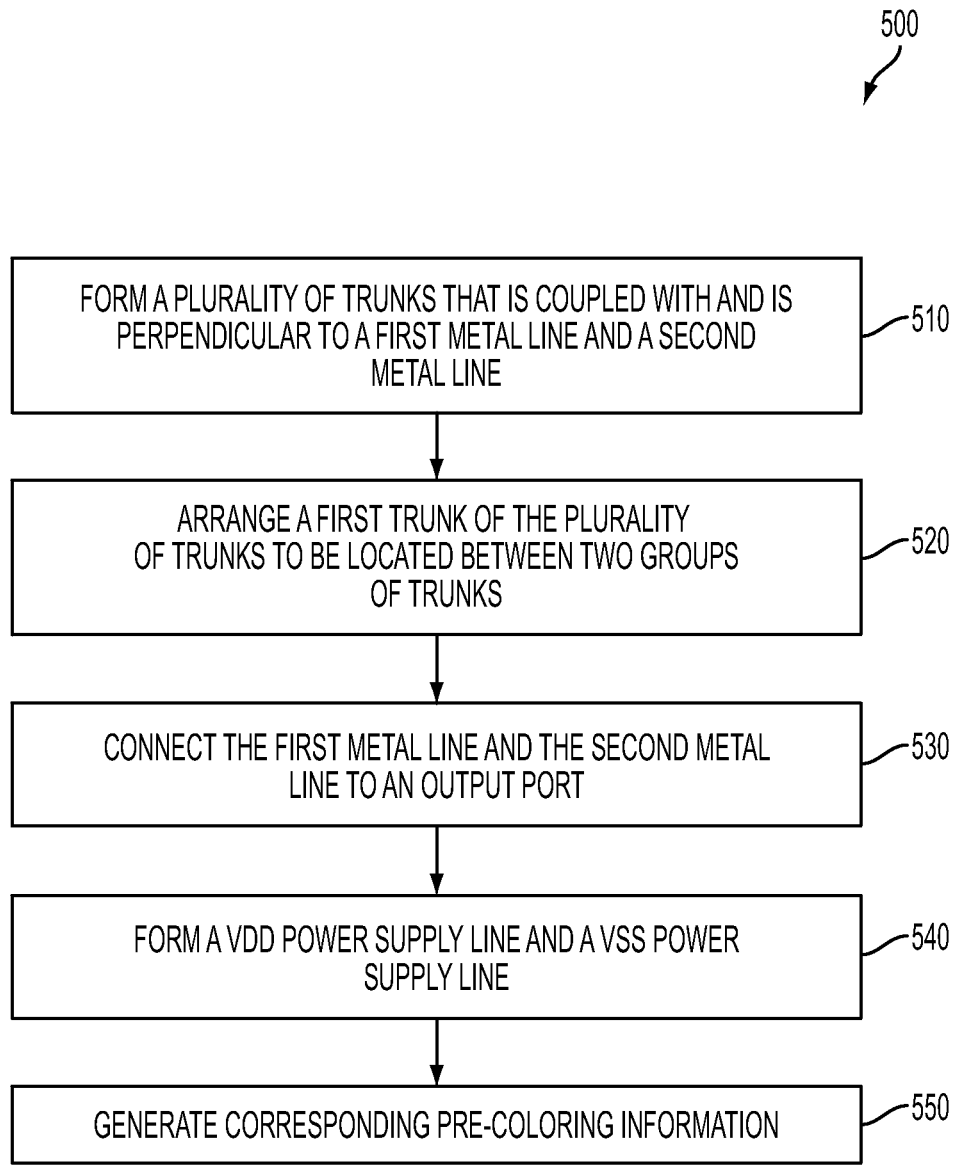
FIG. 5 is a flow chart of a layout method of the inverter gate in FIGS. 1, 2, 3 and 4 in accordance with some embodiments.

FIG. 5 is a flow chart 500 of a layout method of the inverter gate 100 in FIGS. 1, 2, 3 and 4 according to some example embodiments.

In operation 510, a plurality of trunks is formed to be coupled with and perpendicular to a first metal line and a second metal line. The first metal line is coupled with drain regions of PMOS transistors, and the second metal line is coupled with drain regions of NMOS transistors. For example, the plurality of trunks 330-336 and 340 in FIG. 3 are perpendicular to the metal one lines 310 and 320. The metal one line 310 is connected through conductive via zeros 254, upper conductive metal segments 256 and lower conductive metal segments 258 to the drain regions 228 of each of the PMOS transistors of the first transistor region 230 in FIG. 2. The metal one line 320 is connected through conductive via zeros 254, upper conductive metal segments 256 and lower conductive metal segments 258 to the drain regions 244 of each of the NMOS transistors of the second transistor region 240 in FIG. 2.

In operation 520, a first trunk with wider width of the plurality of trunks is arranged to be located between two groups of trunks. For example, the first trunk 350 in FIG. 3 has a width wider than a width of other trunks such as the trunks 330-336 in FIG. 3. The first trunk 350 in FIG. 3 is arranged to be located at the central area of the space between the metal one lines 310 and 320 in FIG. 3 and to be located between one group of trunks, including trunks 330, 332 in FIG. 3, and other group of trunks, including trunks 334, 336 in FIG. 3.

In some embodiments, the width of the first trunk 350 in FIG. 3 is substantially larger than total widths of the trunks 330-336 in FIG. 3. In some embodiments, the width of the first trunk 350 in FIG. 3 is substantially equal to total widths of the trunks 330-336 in FIG. 3. In some embodiments, the width of the first trunk 350 in FIG. 3 is substantially less than total widths of the trunks 330-336 in FIG. 3

In operation 530, the first metal line and the second metal line are connected to an output port. For example, the output port of the inverter gate 100 in FIG. 1 is on the metal two line 262 in FIG. 3. The metal two line 262 in FIG. 3 is disposed over and is electrically coupled with the metal one lines 310 and 320 in FIG. 3 through at least two conductive via ones 264 in FIG. 3. In some embodiments, one of the at least two conductive via ones 264 in FIG. 3 includes a via array that is a group of vias arranged in rows and columns. In some embodiments, one of the at least two conductive via ones 264 in FIG. 3 includes a slot via that extends with a length in a direction that is substantially in parallel with the metal one lines 310 and 320. In some embodiments, one of the at least two conductive via ones 264 in FIG. 3 includes a slot via that extends with a length in a direction that is substantially perpendicular to the metal one lines 310 and 320. In some embodiments, the slot via can be any kinds of shape such as a square, a rectangle, etc.

In some embodiments, the width of the metal two line 262 in FIG. 3 is substantially equal to the width of the first trunk 350 in FIG. 3, and is arranged to be aligned with the left and right side boundaries of the first trunk 340 in FIG. 3. In some embodiments, the width of the metal two line 262 in FIG. 3 is substantially larger than the width of the first trunk 350 in FIG. 3. In some embodiments, the metal two line 262 in FIG. 3 is arranged to be located between two groups of trunks. For example, the metal two line 262 in FIG. 3 is arranged to be located between one group of trunks, including trunks 330, 332 in FIG. 3, and another group of trunks, including trunks 334, 336 in FIG. 3.

In operation 540, a VDD power supply line and a VSS power supply line are formed to couple with source regions of the PMOS transistors and the NMOS transistors, respectively. For example, in FIG. 2, the VDD power supply line 250 is formed to couple through conductive via zeros 254, upper conductive metal segments 256 and lower conductive metal segments 258 with the source regions 226 of the PMOS transistors of the first transistor region 230 in a top-down sequence. The VSS power supply line 252 is formed to couple through conductive via zeros 254, upper conductive metal segments 256 and lower conductive metal segments 258 with the source region 242 of the NMOS transistors of the second transistor region 240 in a top-down sequence.

In operation 550, corresponding pre-coloring information is generated. For example, pre-coloring information is generated such that the metal one line 260 in FIG. 3 is arranged to be on one mask, and the metal one lines 250 and 252 in FIG. 3 are arranged to be on another mask. For another example, pre-coloring information is generated such that the metal one line 266 in FIG. 3 is arranged to be on the same mask as the metal one lines 250 and 252 in FIG. 3. For another example, pre-coloring information is generated such that the metal one line 266 in FIG. 3 is arranged to be on the same mask as the metal one line 260 in FIG. 3.

One aspect of this description relates to an integrated circuit layout. The integrated circuit layout includes a P-type active region and an N-type active region, and a plurality of trunks. The integrated circuit layout further includes a first metal connection connected to the P-type active region; and a second metal connection connected to the N-type active region. Each trunk of the plurality of trunks is electrically connected with the first metal connection and the second metal connection. Each trunk of the plurality of trunks is substantially perpendicular to the first metal connection and the second metal connection. A first trunk of the plurality of trunks has a width wider than a width of other trunks of the plurality of trunks.

Another aspect of this description relates to a cell layout. The cell layout includes a P-type active region and an N-type active region, and a plurality of trunks. The cell layout further includes a first metal connection connected to the P-type active region, and a second metal connection connected to the N-type active region. The cell layout further includes a VDD power supply line connected to the P-type active region, and a VSS power supply line connected to the N-type active region. Each trunk of the plurality of trunks is electrically connected with the first metal connection and the second metal connection. Each trunk of the plurality of trunks is substantially perpendicular to the first metal connection and the second metal connection. Each trunk of the plurality of trunks is substantially perpendicular to the VDD power supply line and the VSS power supply line. A first trunk of the plurality of trunks has a width wider than a width of other trunks of the plurality of trunks and is arranged to be located between two groups of trunks.

Still another aspect of this description relates to a method of forming an integrated circuit layout. The method includes forming a plurality of trunks, each trunk of the plurality of trunks coupled with and perpendicular to a first metal line and a second metal line, the first metal line being coupled with a plurality of PMOS transistors, the second metal line being coupled with a plurality of NMOS transistors, wherein a width of the first trunk is substantially larger than widths of other trunks of the plurality of trunks. The method further includes forming a VDD power supply line coupled with the plurality of PMOS transistors. The method further includes forming a VSS power supply line coupled with the plurality of NMOS transistors. The method further includes generating, using a processor, pre-coloring information for each of the first metal line, the second metal line, the VDD power supply line, and the VSS power supply line. The method further includes assigning, using the processor, each of the first metal line, the second metal line, the VDD power supply line, and the VSS power supply line to a mask based on the pre-coloring information.

While the disclosure has been described by way of examples and in terms of disclosed embodiments, the invention is not limited to the examples and disclosed embodiments. To the contrary, various modifications and similar arrangements are covered as would be apparent to those of ordinary skill in the art. Therefore, the scope of the appended claims should be accorded the broadest interpretation so as to encompass such modifications and arrangements.

What is claimed is:

1. An integrated circuit layout, comprising:
a P-type active region and an N-type active region;
a plurality of trunks;
a first metal connection connected to the P-type active region; and
a second metal connection connected to the N-type active region,
wherein
each trunk of the plurality of trunks is electrically connected with the first metal connection and the second metal connection;
each trunk of the plurality of trunks is substantially perpendicular to the first metal connection and the second metal connection; and
a first trunk of the plurality of trunks has a width wider than a width of other trunks of the plurality of trunks.

2. The integrated circuit layout of claim 1, wherein the first metal connection includes a plurality of jogs, and the plurality of jogs extends from a side of the first metal connection opposite the plurality of trunks.

3. The integrated circuit layout of claim 2, further comprising a power supply line extending parallel to the first metal connection, wherein the power supply line comprises a plurality of protrusions extending from a surface of the power supply line closest to the first metal connection.

4. The integrated circuit layout of claim 3, wherein the plurality of protrusions is arranged in an alternating fashion with the plurality of jogs in a direction parallel to the power supply line.

5. The integrated circuit layout of claim 1, further comprising an output line connected to the first metal connection and to the second metal connection.

6. The integrated circuit layout of claim 5, wherein the output line is located on a level above the plurality of trunks, the output line is connected to the first metal connection by at least one first via, and the output line is connected to the second metal connection by at least one second via.

7. The integrated circuit layout of claim 6, wherein a width of the output line is equal to a width of the width of the first trunk of the plurality of trunks.

8. The integrated circuit layout of claim 1, further comprising a metal structure connected to the P-type active region and to the N-type active region, wherein the metal structure is separated from the plurality of trunks, the first metal connection and the second metal connection.

9. A cell layout, comprising:
a P-type active region and an N-type active region;
a plurality of trunks;
a first metal connection connected to the P-type active region;
a second metal connection connected to the N-type active region;
a VDD power supply line connected to the P-type active region; and
a VSS power supply line connected to the N-type active region, wherein
- each trunk of the plurality of trunks is electrically connected with the first metal connection and the second metal connection;
- each trunk of the plurality of trunks is substantially perpendicular to the first metal connection and the second metal connection;
- each trunk of the plurality of trunks is substantially perpendicular to the VDD power supply line and the VSS power supply line; and
- a first trunk of the plurality of trunks has a width wider than a width of other trunks of the plurality of trunks and is arranged to be located between two groups of trunks.

10. The cell layout of claim 9, wherein the second metal connection includes a plurality of jogs, and the plurality of jogs extends from a side of the second metal connection opposite the plurality of trunks.

11. The cell layout of claim 10, wherein the VSS power supply line comprises a plurality of protrusions extending toward the second metal connection.

12. The cell layout of claim 11, wherein the plurality of protrusions is arranged in an alternating fashion with the plurality of jogs in a direction parallel to the VSS power supply line.

13. The cell layout of claim 9, further comprising an output line connected to the first metal connection through at least one via and to the second metal connection through at least one via.

14. The cell layout of claim 13, wherein a width of the output line is equal to a width of the width of the first trunk of the plurality of trunks.

15. A method of forming an integrated circuit layout, the method comprising:
- forming a plurality of trunks, each trunk of the plurality of trunks coupled with and perpendicular to a first metal line and a second metal line, the first metal line being coupled with a plurality of PMOS transistors, the second metal line being coupled with a plurality of NMOS transistors, wherein a width of the first trunk is substantially larger than widths of other trunks of the plurality of trunks;
- forming a VDD power supply line coupled with the plurality of PMOS transistors;
- forming a VSS power supply line coupled with the plurality of NMOS transistors;
- generating, using a processor, pre-coloring information for each of the first metal line, the second metal line, the VDD power supply line, and the VSS power supply line; and
- assigning, using the processor, each of the first metal line, the second metal line, the VDD power supply line, and the VSS power supply line to a mask based on the pre-coloring information.

16. The method of claim 15, wherein the assigning comprises assigning the first metal line and the second metal line to a first mask.

17. The method of claim 16, wherein the assigning comprises assigning at least one of the VDD power supply line or the VSS power supply line to a second mask different from the first mask.

18. The method of claim 15, further comprising forming a metal structure on a same metal level as the first metal line, the second metal line, the VDD power supply line, and the VSS power supply line.

19. The method of claim 18, further comprising assigning the metal structure to a same mask as at least one of the first metal line or the second metal line.

20. The method of claim 18, further comprising assigning the metal structure to a same mask as at least one of the VDD power supply line or the VSS power supply line.

* * * * *